United States Patent [19]

Shappir

[11] Patent Number: 5,332,913
[45] Date of Patent: Jul. 26, 1994

[54] BURIED INTERCONNECT STRUCTURE FOR SEMICONDUCTOR DEVICES

[75] Inventor: Joseph Shappir, Jerusalem, Israel

[73] Assignee: Intel Corporation, Santa Clara, Calif.

[21] Appl. No.: 811,453

[22] Filed: Dec. 17, 1991

[51] Int. Cl.$^5$ ............... H01L 27/02; H01L 23/48; H01L 29/46; H01L 29/62

[52] U.S. Cl. ............... 257/305; 257/333; 257/389; 257/632; 257/748; 257/750; 257/754; 257/755; 257/757; 257/49; 257/66; 257/763; 257/52

[58] Field of Search ............... 357/42, 67, 71, 44, 357/65, 23.11; 257/333, 389, 632, 49, 66, 748, 750, 754, 757, 763, 52

[56] References Cited

U.S. PATENT DOCUMENTS 4,730,208  3/1988  Sugino et al. ............... 357/23.11
4,886,764 12/1989  Miller et al. ............... 357/71

OTHER PUBLICATIONS

D. C. Chen, et al., *A New Device Interconnect Scheme For Sub-micron VLSI*, IEDM, pp. 118–121, (1984).

V. V. Lee, et al., *A Selective CVD Tungsten Local Interconnect Technology*, IEDM, pp. 450–453, (1988).

T. E. Tang, et al., *Titanium Nitride Local Interconnect Technology for VLSI*, IEEE Transactions on Electron Devices, col. ED-34, No. 3, pp. 682–687, (Mar. 1987).

D. C. Thomas, et al., *A Multileve Tungsten Interconnect Technology*, IEDM, pp. 466–469, (1988).

R. A. Chapman, et al., *An 0.8 μm CMOS Technology For High Performance Logic Applications*, IEDM, pp. 362–365, (1987).

F. Mieno, et al., *Novel Selective Poly-And Epitaxial-Silicon Growth (SPEG) Technique For ULSI Processing*, IEDM, pp. 16–19, (1987).

*Primary Examiner*—Andrew J. James
*Assistant Examiner*—Carl Whitehead, Jr.
*Attorney, Agent, or Firm*—Blakely, Sokoloff, Taylor & Zafman

[57] ABSTRACT

An improved density semiconductor device having a novel buried interconnect is described. The buried interconnect electrically connects electrical device regions on a semiconductor substrate such that other structures may directly overlie the buried interconnect but not be electrically connected to the electrically conductive portions of the interconnect. The interconnect is composed of a buried conductor and conductive segments. The conductive segments are electrically joined to the buried conductor so as to form an electrical pathway. First, a buried conductor is formed over an oxidized portion of a first field oxide. A layer of selective poly-epi silicon is then grown over the surface of the substrate. A nonconductive portion of selective poly-epi silicon is then formed over the buried conductor by oxidizing at least some of the selective poly-epi silicon layer. This nonconductive portion of the selective poly-epi silicon allows other structures to be formed over the buried conductor which are not in direct electrical contact with the buried interconnect. These other structures include elevated source/drain type structures, gates and silicidized or refractory metal local interconnects. These other structures may be selectively connected electrically to the conductive portions of the buried interconnect by the use of silicide segments or by the use of silicide segments connected electrically to titanium nitride pads. The conductive portion of the buried interconnect includes the buried conductor, and conductive segments which are formed by either silicon or silicide and which may include refractory metal pads. Silicide segments and titanium nitride pads are formed by depositing, annealing and etching a layer of refractory metal.

30 Claims, 8 Drawing Sheets

BURIED INTERCONNECT STRUCTURE FOR SEMICONDUCTOR DEVICES

BACKGROUND OF THE INVENTION

1. Field of the Invention

This invention relates to the field of MOS and bipolar (including Bi-MOS and Bi-CMOS) integrated circuits and more specifically to a process for making contact between different transistor diffusion regions and between transistor diffusion regions and gate layer polysilicon on a silicon substrate. This contact method is coupled with the use of elevated source/drain type structures and silicidized or refractory metal local interconnect segments to form integrated circuits having an increased device density.

2. Prior Art

In the manufacture of semiconductor devices, there is a need to make electrical contacts between certain regions of the substrate. Prior art techniques have traditionally used the first and second metal layers or buried contacts to make contact between these regions. Prior art techniques first form device regions. The device regions may be transistors or may be small numbers of transistors connected together. The semiconductor surface is then covered by at least one layer of dielectric material. This dielectric is then masked and etched to form openings in the dielectric known as contact holes or vias. These openings expose the portions of the substrate which are to be contacted. Next, a layer of conductive material is deposited on the surface of the substrate so as to cover any overlying dielectric and to fill the openings. This layer is known as "first metal". The conductive material is then covered with photoresist. The photoresist is then patterned and an etch is performed to remove predetermined portions of the metal layer. The remaining photoresist is then removed leaving conductive material which has been patterned to form interconnect lines between the via openings. These interconnect lines electrically connect different device areas on the substrate and allow for electrical contact to external leads. Due to the requirements for increased density of semiconductor devices, the semiconductor manufacturing industry has increased the number of devices and features on any given semiconductor surface. Until recently, this process has consisted mainly of miniaturization of existing designs and components.

The first and second metalization layers seriously limit the density of integrated circuits. In prior art processes, the metal layers are used to connect the transistor drains of every CMOS inverter or gate and to connect the transistor drains to the gates of the next stage.

One method for forming a direct contact between p-channel and n-channel transistors and between diffusion and gate without the use of first metal is the use of self-aligned silicides. These self-aligned silicides are formed by depositing and annealing a layer of refractory metal. The refractory metal will react with the silicon to form a silicide and will react with the annealing gas to form a top refractory metal compound layer (often a nitride such as titanium nitride). Prior art methods traditionally have removed the refractory metal compound layer leaving the silicide as the conductive layer. One prior art process has formed local interconnects by using portions of the refractory metal compound layer formed by means of an additional photolithographic step as local interconnect pads (also called straps). One such process anneals titanium in a nitrogen environment to form titanium nitride and titanium silicide. The titanium nitride is then masked and selectively etched to form titanium nitride pads which form local interconnects over regions where silicide has not been formed. This titanium interconnect technology allows for minimum geometry junctions giving improved circuit performance and increased device density. This technology allows for local interconnects to be formed to connect transistor sources and drains of every inverter or gate and to connect the transistor drains with the gates of the next state. But the prior art process of connecting gates using titanium silicide and/or titanium nitride interconnects does not provide for crossover of gates within a device region without contact to the crossover gates. Thus, prior art processes having non-electrically coupled crossover structures which pass through a device region still require the use of first metal. A crossing can be isolated by the use of a second polysilicon layer, but this layer presents serious step coverage problems as well as requiring additional undesired high temperature steps. Another drawback of the prior art contact processes is that they require dedicated diffusion areas resulting in significant contribution to junction capacitance and consequently slower circuit performance. What is needed is a method for forming local interconnects without the use of first metal which also allows for non-coupled crossover of gate structures and preferably reduced junction area.

Another problem with prior art processes is that the distance between N+ and P+ diffusion into single crystal silicon has to be maintained. If the distance between N+ and P+ diffusion areas is not maintained, latch-up will occur. What is needed is a process which will allow the source and drain structures to be placed closer together without causing latch-up.

SUMMARY OF THE INVENTION

This invention describes a process for forming an improved density MOS semiconductor device on a silicon substrate.

Improved density can be realized by using a novel buried interconnect to electrically couple transistor diffusion regions with each other and to couple transistor diffusion regions with gate layers. This buried interconnect method uses an elevated source/drain structure formed by selective poly-epi silicon growth and silicidized source/drain/gate interconnect segments. Ordinary processing methods are used to form a first field oxide and any underlying features upon a silicon substrate. A buried conductor is then formed over a portion of the field oxide layer. Next, a layer of selective poly-epi is grown over the semiconductor substrate surface. Predetermined portions of the layer of selective poly-epi silicon are then oxidized. The oxidation will form a second field oxide, and oxide regions will be formed over the buried conductor and around device regions so as to isolate devices. Next, gate structures are formed within the device region of the selective poly-epi layer and on top of the field oxide regions. Layers of conductive material are then deposited, silicidized, and etched so as to form silicide segments. These silicide segments electrically couple diffusion areas to each other and electrically couple diffusion areas to the gates of the next stage. The silicide segments also make electrical contact with the buried conductor. The silicide segments, which are electrically coupled to the buried conductor, form electrical pathways which electrically couple diffusion areas to each other and which electrically couple diffusion areas to the gates of the next stage. The electrical pathway which is formed by a buried conductor and the silicide segments which are electrically coupled to the diffusion areas and/or gate layer will be referred to as a buried interconnect. The buried interconnect allows for crossover of gates and for easy electrical connection to those gates which are to be electrically connected. The combination of buried interconnect, elevated source/drain structures, and silicidation allows for a significant increase in device density.

DETAILED DESCRIPTION OF THE INVENTION

An invention is described for the formation of a novel buried interconnect on a semiconductor substrate. In the following description, numerous specific details are set forth such as thicknesses, types of material used, basic processing steps, etc. in order to provide a thorough understanding of the present invention. It will be obvious, however, to one skilled in the art that the present invention can be practiced without these specific details. In other instances, well known process steps have not been described in detail in order not to obscure unnecessarily the present invention.

The invention is described as it would be incorporated into a complementary metal oxide semiconductor (CMOS) device. This description is for illustration purposes only, and one with skill in the art would realize that the present invention could be practiced on other types of semiconductor devices.

Figure 1:
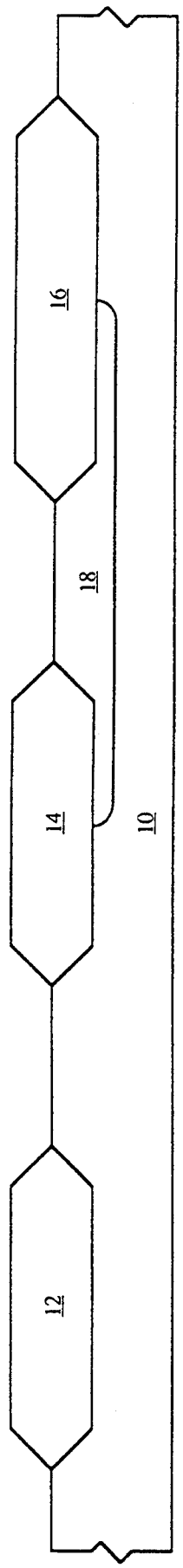
FIG. 1 shows a silicon substrate having a field oxidation layer and a P-well defined thereon.

The first process step requires a formation of field oxide regions and any underlying features. FIG. 1 shows semiconductor substrate 10 with field oxide regions 12, 14, and 16. FIG. 1 also shows P-well 18. The P-well 18 is merely representative of one of the types of underlying features which can be developed in the semiconductor substrate. Other types of structures, such as N-wells, could also be incorporated into a given semiconductor substrate. Both the P-well and the field oxide regions are formed by methods well known to those skilled in the art. In the currently preferred embodiment, the P-well is formed by performing a thin oxidation, a masking step, a boron implant, and a drive in step. An etch step then removes the thin oxidized layer and the masking layer. In the currently preferred embodiment, the field oxide regions are formed by performing a thin oxidation, a nitride layer deposition, a masking step, and an etch, followed by oxidation of the exposed silicon. The residual nitride and the thin oxide layer are then removed by a cleaning step. The currently preferred embodiment has an oxidation thickness of approximately 4000 Å. There may be any number of P-wells and field oxide regions formed on a given semiconductor substrate.

Figure 2:
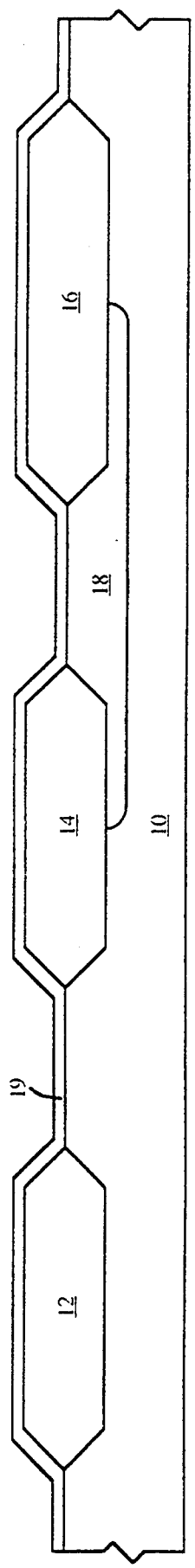
FIG. 2 shows the substrate of FIG. 1 after the formation of a layer of conductive material.
Figure 3:
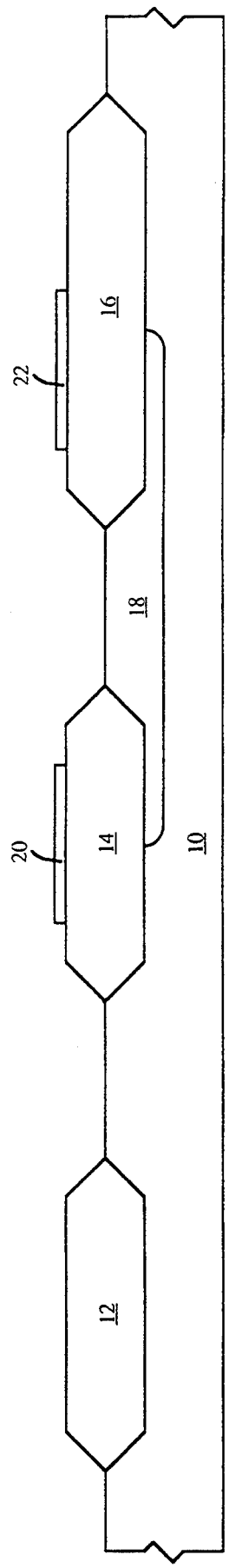
FIG. 3 shows the substrate of FIG. 2 after a mask step and an etch step have formed the buried conductor.

Next, a buried conductor is formed over those portions of the field oxide regions which will require crossover of subsequent conductive layers. In the currently preferred embodiment, buried conductors are formed by the deposition of a layer of conductive material and the subsequent etch thereof. FIGS. 2 and 3 show how buried conductors may be formed over, for example, oxide regions 14 and 16. In the currently preferred embodiment, a layer of conductive material is first deposited over the semiconductor substrate. FIG. 2 shows layer of conductive material 19 deposited over the semiconductor substrate. The conductive material may be a refractory metal, a silicide, doped silicon, or a combination of doped silicon and silicide. The currently preferred embodiment uses a three-layer structure of polysilicon/tungsten silicide/polysilicon with a total thickness of approximately 1200 Å.

Next, the layer of conductive material 19 is patterned, masked, and etched to form buried conductors. FIG. 3 shows the substrate of FIG. 2 after the layer of conductive material 19 has been masked and etched to form buried conductors 20 and 22. Buried conductors 20 and 22 are electrically isolated from semiconductor substrate 10 by field oxide regions 14 and 16 such that current will not flow between the substrate 10 and the buried conductors 20 and 22.

Figure 4:
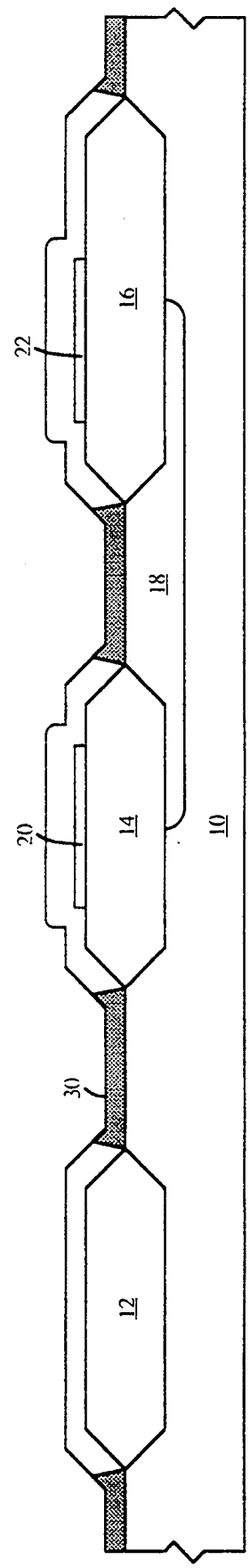
FIG. 4 shows the substrate of FIG. 3 after the growth of a layer of selective poly-epi silicon.

A layer of selective poly-epi silicon is then grown over the surface of the semiconductor substrate. The poly-epi layer can be doped either p-type or n-type to a level suitable for a substrate for a CMOS process. FIG. 4 shows selective poly-epi layer 30 after its growth over the surface of the semiconductor substrate. This type of layer will form polysilicon over those regions which contain field oxides or buried conductors. Thus, the portions of selective poly-epi layer 30 which overlie field oxide regions 12, 14, and 16 and buried conductors 20 and 22 will be polysilicon. The growth of selective poly-epi layer 30 will form single crystal silicon of epitaxial quality in all regions of exposed silicon substrate. In the currently preferred embodiment, the selective poly-epi layer 30 has a thickness of approximately 1200 Å. The approximate boundaries of the portion of poly-epi layer 30 which is of epitaxied quality are shown shaded in FIG. 4. For a description of a selective poly-epi silicon growth process see, "Novel Selective Poly- and Epitaxial-Silicon Growth (SPEG) Technique For ULSI Processing", by F. Mieno, et al., IEDM, pp. 16–19 (1987). Alternatively, layer 30 could be formed by solid phase epitaxy of a deposited layer of amorphous silicon.

Figure 5:
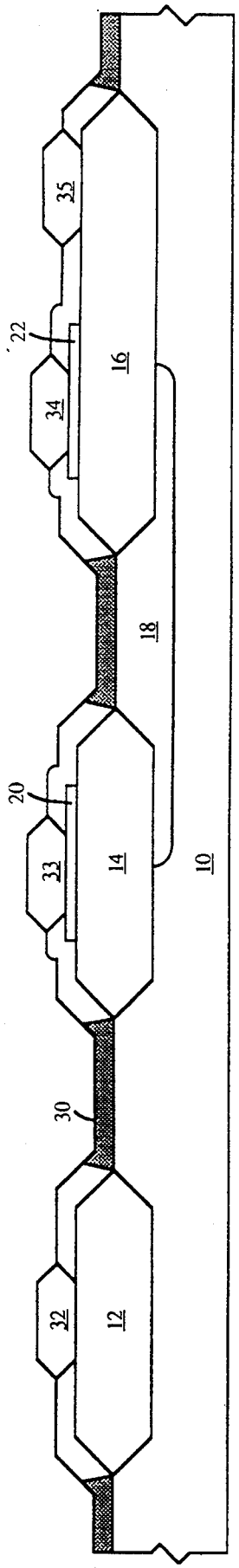
FIG. 5 shows the substrate of FIG. 4 after a selective oxidation step.

The device regions may then be isolated and crossover structures formed by the complete oxidation of portions of selective poly-epi layer 30 to form a second level of field oxide. In the currently preferred embodiment, the field oxide regions are formed by performing a thin oxidation, a nitride layer deposition, a masking step, and an etch followed by oxidation of the exposed silicon. The residual nitride, and the thin oxide layer are then removed by a cleaning step. The currently preferred embodiment has a second level oxidation thickness of approximately 2500 Å. The top polysilicon layer of the buried conductor in the preferred embodiment serves as a protection for the silicide against excess oxidation during the oxidation of the selective poly-epi layer. FIG. 5 shows the substrate of FIG. 4 after second level field oxide regions 32–35 have been formed therein. Field oxide regions, such as oxide region 32 and oxide region 35, can be used to isolate electrically portions of the selective poly-epi layer 30 between the field oxide regions. The isolated portion of the poly-epi layer 30 between field oxide regions 32 and 35 will be referred to as a device region. FIG. 5 also shows two crossover structures formed by field oxide regions 33 and 34 which overlie buried conductors 20 and 22. In order to make electrical connections between regions separated by crossover structures, contact is made with each buried conductor from both sides of each crossover structure. This contact may be made within or through selective poly-epi layer 30. Because buried conductors 20 and 22 underlie second field oxide regions 33 and 34, other conductive regions may be formed on top of field oxide region 33 and 34 those regions not making electrical contact with selective poly-epi layer 30.

Figure 6:
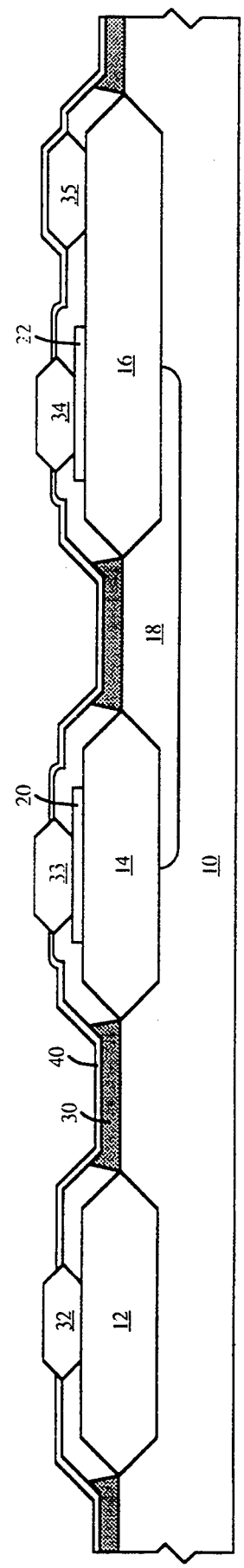
FIG. 6 shows the substrate of FIG. 5 after the formation of a thin film of gate oxide.

Next, source, drain, and gate structures are defined and formed on the surface of the semiconductor substrate. FIG. 6 through FIG. 11 show the formation of gates, sources, and drain structures. These structures are formed by methods well-known to those skilled in the art. First, a thin film of oxide is formed on the exposed silicon surfaces of the semiconductor substrate. The thickness of the oxide layer in the currently preferred embodiment is approximately 200 Å. FIG. 6 shows oxide layer 40 formed over the semiconductor surface.

Figure 7:
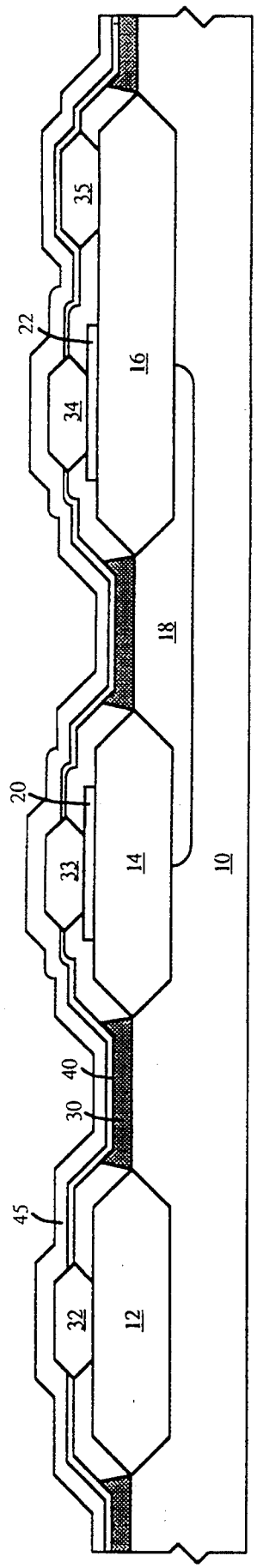
FIG. 7 shows the substrate of FIG. 6 after the deposition of a gate layer.
Figure 8:
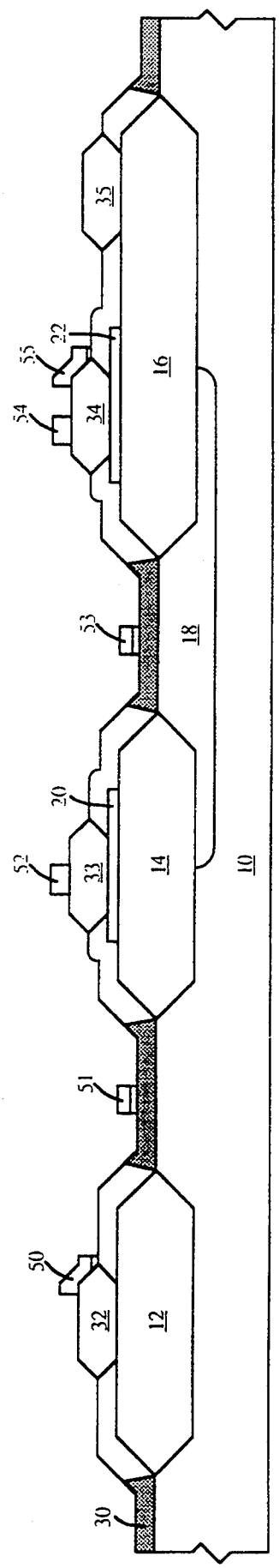
FIG. 8 shows the substrate of FIG. 7 after mask and etch steps have defined gates.

Next, a gate layer of silicon is deposited over oxide layer 40. In the currently preferred embodiment, the thickness of the gate layer polysilicon is approximately 3,250 Å. FIG. 7 shows the deposition of polysilicon layer 45 over the surface of the substrate 10. Next, polysilicon layer 45 and oxide layer 40 are patterned, masked, and etched to define gate structures. FIG. 8 shows the structure of FIG. 7 after patterning, masking and etching of polysilicon layer 45 and oxide layer 40. Examples of gate structures defined by this process are gates 50–55. Gates 51 and 53 will be referred to as device gates. Gates 52 and 54 will be referred to as crossover gates as these gates cross over but are not electrically connected to the buried conductors. Gates 50 and 55 are referred to as connected crossover gates because theses gates are to be electrically coupled with the active device region shown.

Next, low-dose implants are performed to create the basis for lightly doped drain regions (LDD) by a series of steps well known in the prior art.

Figure 9:
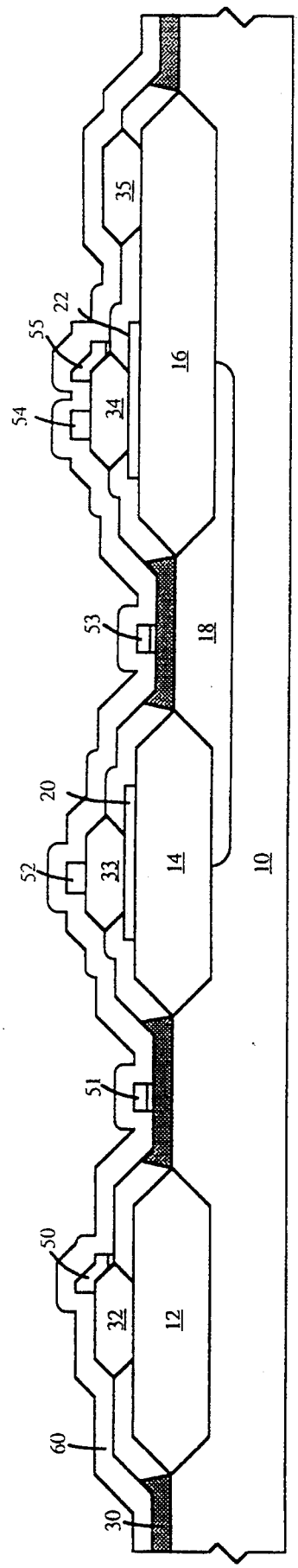
FIG. 9 shows the substrate of FIG. 8 after the deposition of an oxide spacer layer.
Figure 10:
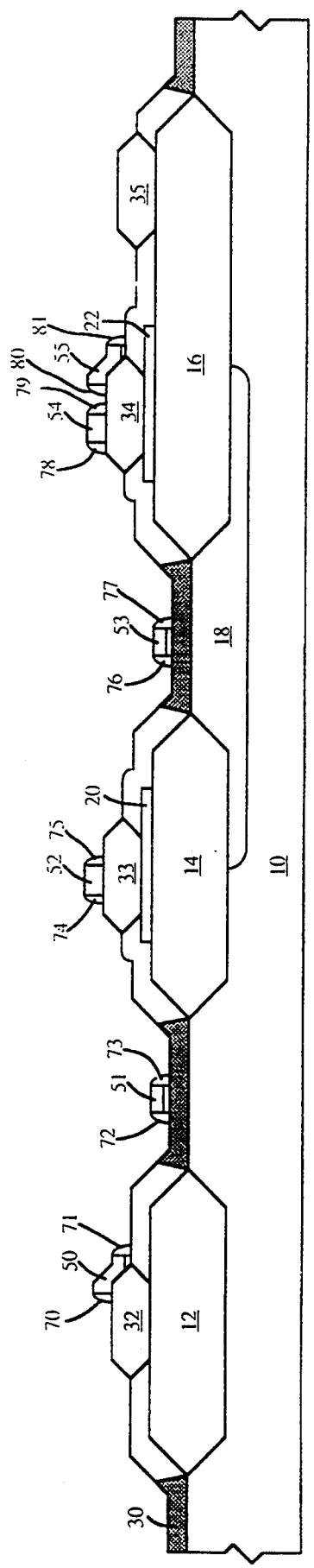
FIG. 10 shows the substrate of FIG. 9 after an anisotropic etch step has formed spacers on the sides of each of the gate structures.
Figure 11:
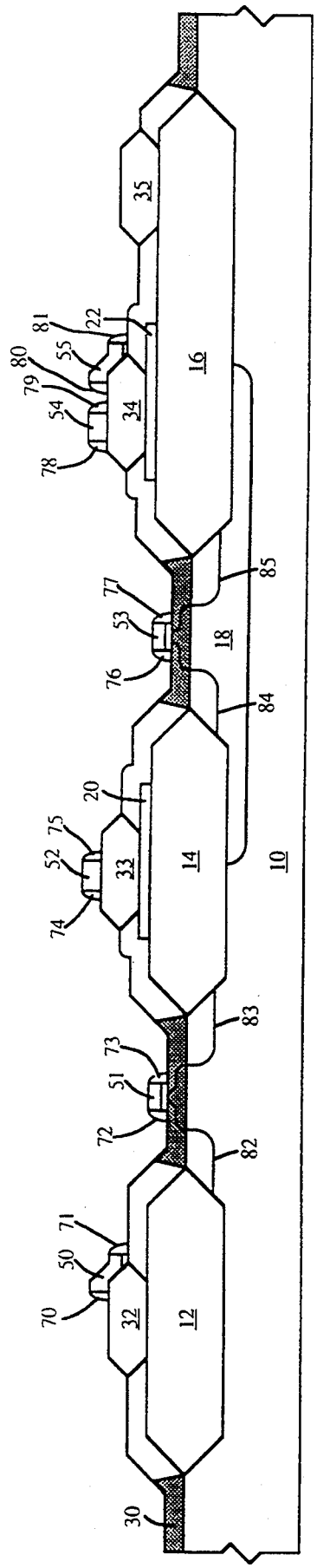
FIG. 11 shows the substrate of FIG. 10 after mask and implant steps have fully defined source and drain regions.

Next, spacers are formed around the gate structures. The currently preferred embodiment forms and defines spacers by the deposition and each of an oxide spacer layer. FIG. 9 shows oxide spacer layer 60 deposited on top of the semiconductor substrate. Oxide spacer layer 60 is then anisotropically etched to form spacers. FIG. 10 shows the structure of FIG. 9 after the etch of silicon oxide layer 60 to define spacers 70–81. Sources and drains are formed by performing a masking step followed by an implant step. The currently preferred embodiment uses an implant of arsenic and a second implant of boron. FIG. 11 shows the structure of FIG. 10 after implants have defined sources 82 and 85 and drains 83 and 84. In the currently preferred embodiment, a series of steps well known in the prior art is used to form lightly doped drain regions (LDD) within source and drain regions 82–85 to extend the source and drain regions under gates 51 and 53.

Figure 12:
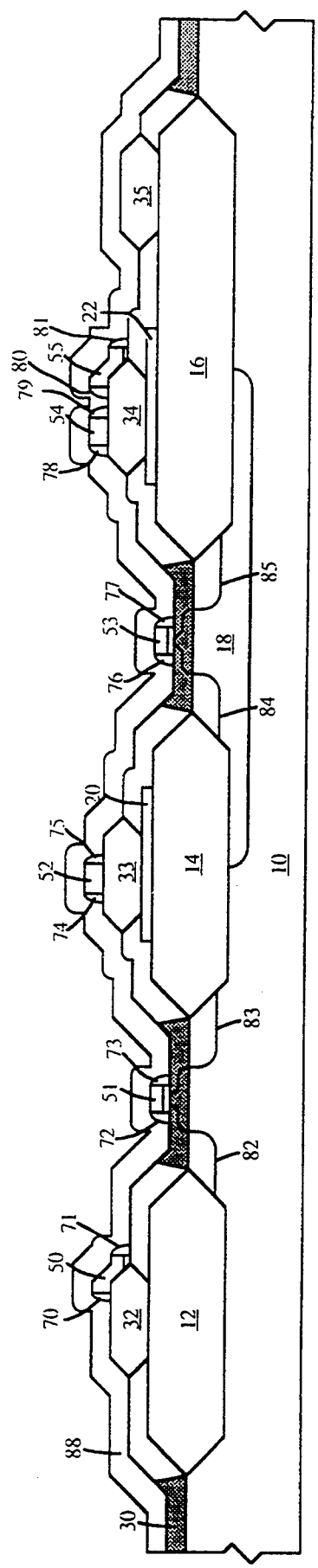
FIG. 12 shows the substrate of FIG. 11 after the deposition of a layer of conductive material.

A conductive layer must next be formed on the semiconductor substrate. In the currently preferred embodiment, this conductive layer is made of titanium which is annealed to form an underlying layer of titanium silicide (TiSi$_2$) over regions of exposed silicon and an overlying layer of titanium nitride (TiN). FIG. 12 shows the semiconductor substrate of FIG. 11 after titanium layer 88 has been deposited thereon. In the currently preferred embodiment, titanium is sputter deposited to a thickness of approximately 800 Å. In the currently preferred embodiment, the silicide is formed by annealing the titanium at a temperature of approximately 850° C. in a nitrogen gas environment.

Figure 13:
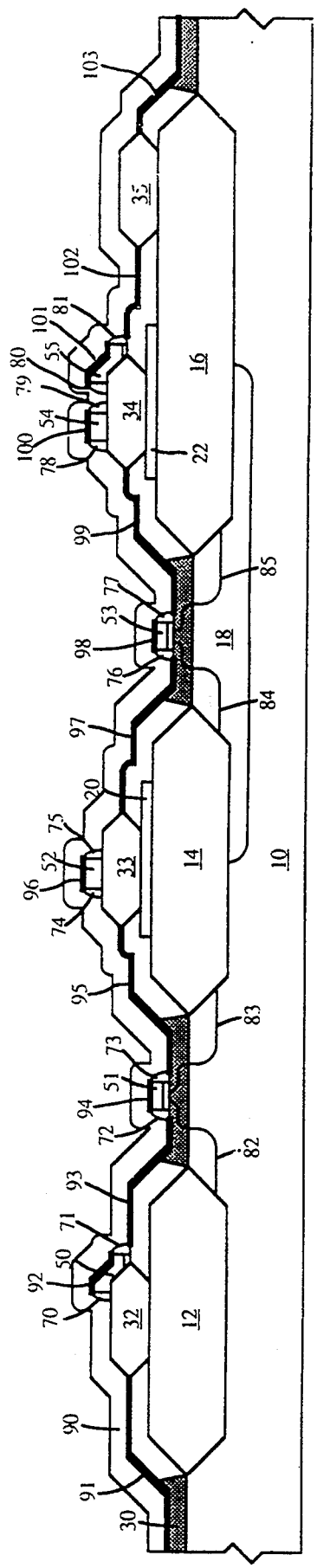
FIG. 13 shows the substrate of FIG. 12 after the silicidation of the conductive layer.

FIG. 13 shows the structure of FIG. 12 after silicidation of titanium layer 88. The silicidation will form titanium silicide over all regions where the titanium layer was in direct contact with underlying silicon or polysilicon and titanium nitride layer 90 over the entire area. The silicidation will form titanium silicide segments 91–103. Silicide segments 92, 94, 96, 98, 100, and 101 will be formed over gate structures so as to fully define individual highly conductive gates. Silicide segments 91, 93, 95, 97, 99, 102, and 103 form highly conductive segments which are used to electrically couple diffusion regions to each other and to couple diffusion regions to gates. At each juncture of a silicide segment and an underlying buried conductor, the juncture will allow for the free flow of electrical current between the silicide segment and the buried conductor. Next, titanium nitride layer 90 will be patterned, masked, and etched so as to remove the titanium nitride layer and residual titanium layer from all areas except for those areas which require electrical connection over areas where silicide has not formed. Since silicide will not form over spacers, titanium nitride pads may be formed over the spacers to connect adjoining silicide segments.

Figure 14:
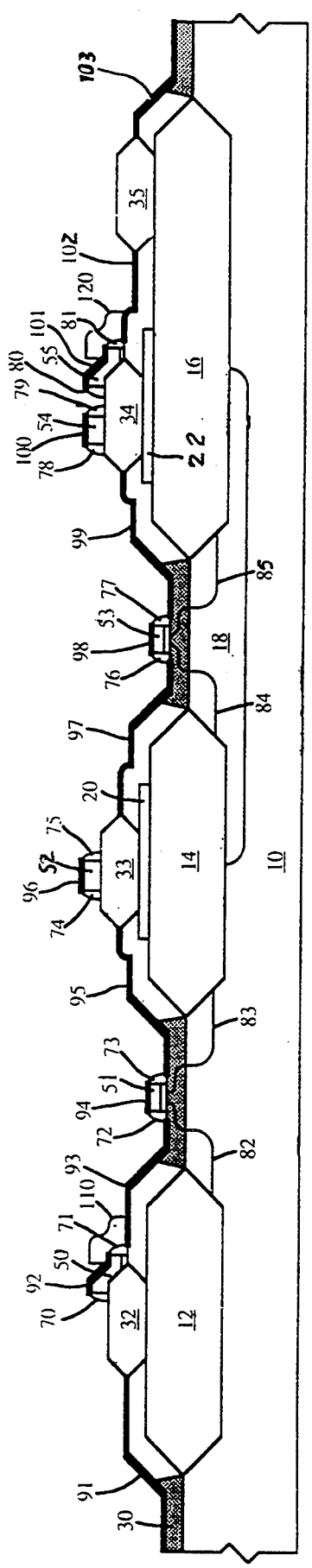
FIG. 14 shows the substrate of FIG. 13 after mask and etch of unsilicided portions of the layer of conductive material.

FIG. 14 shows the silicon substrate after masking and etching titanium nitride layer 90 so as to leave titanium nitride pads 110 and 120 over spacers 71 and 81. Titanium nitride pad 110 acts to electrically connect silicide segment 92 with silicide segment 93, forming an interconnect between gate 50 and the diffusion area of source 82. Silicide segment 95 electrically connects the diffusion area of drain 83 with buried conductor 20 which is electrically connected with silicide segment 97. This series of conductive strips allows electrical current to freely flow between the diffusion area of drain 83 and the diffusion area of drain 84. Since the electrical connection is made below oxidized region 33, a crossover structure such as gate 52 may be formed which does not short the buried interconnect.

Silicide segment 99 electrically connects the diffusion area of source 85 with buried conductor 22. Buried conductor 22 is also electrically coupled to silicide segment 102. As silicide has not formed over spacer 81, electrical connection between silicide segment 101 and silicide segment 102 is made by titanium nitride pad 120. Conductive segments 99 and 102, in conjunction with buried conductor 22 and titanium nitride pad 120, allow for direct electrical connection between the diffusion area of source 85 and silicide segment 101 of gate 55. The buried interconnect structure allows gate 54 to cross over the buried interconnect structure without shorting the gate with the buried interconnect. Standard MOS processing steps are then performed on the semiconductor substrate so as to fully define the semiconductor device.

One with skill in the art would realize that there are alternative methods for forming a buried interconnect. One such method would involve the deposition of an electrically conductive layer such as layer 88 shown in FIG. 12 but would not involve a silicidation step. The conductive layer would then be patterned, masked, and etched to form electrical contact between diffusion areas and gate structures. Additionally, electrical contact could be established by doping those regions of layer 30 and those portions of gates 50–55 which require electrical conductivity.

Figure 15:
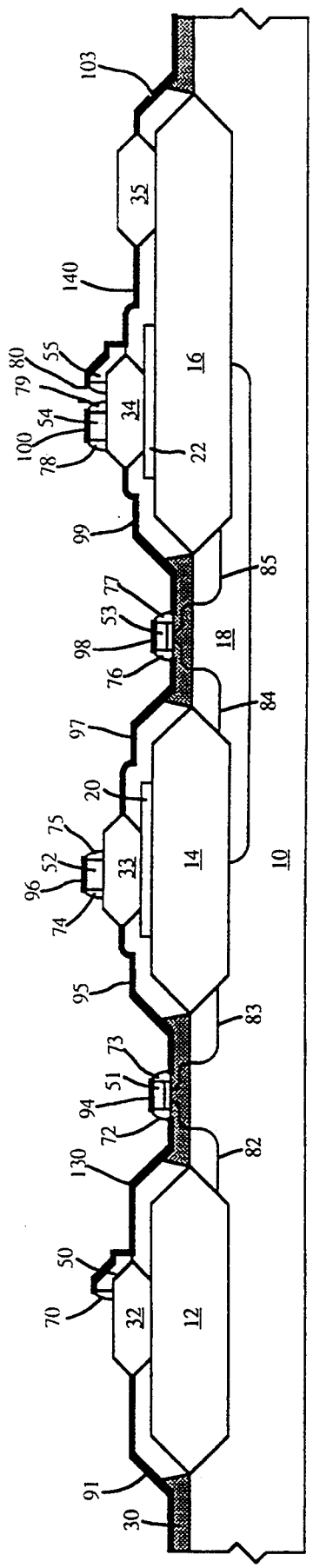
FIG. 15 shows an alternate embodiment which does not require the use of conductive pads.

FIG. 15 shows an alternate embodiment which does not require the use of titanium nitride pads 110 and 120 of FIG. 14. In this embodiment, additional patterning, masking, and etching steps eliminate spacers 71 and 81 prior to the deposition of titanium layer 88 of FIG. 12. Silicidation of titanium layer 88 and etch of titanium nitride layer 90 will form silicide segments 130 and 140. Silicide segments 92 and 93 of FIG. 14 will be replaced by silicide segment 130. Silicide segment 130 will make contact between gate 50 and the diffusion area of source 82. Silicide segments 101 and 102 of FIG. 14 will be replaced by silicide segment 140. Silicide segment 140 will then make contact between buried conductor 22 and gate 55.

The present invention defines a buried interconnect structure which allows for non-shorted crossover of gates and easy connection directly to crossover gates. The combination of buried interconnects, elevated source/drain structures, and silicide segments allows for the formation of crossover gates transistors and device regions to be spaced closer together. Thus, a significant reduction in the size of a semiconductor integrated circuit may be realized. The accompanying decrease in junction areas will result in reduced load capacitances and subsequent increase in speed.

I claim:

1. A buried interconnect on a semiconductor substrate, said substrate having a first conductive region, a nonconductive region, and a second conductive region, said first conductive region a being a diffusion region, comprising:

a) a buried conductor which at least partially overlies said nonconductive region;
   b) a silicon layer which partially overlies said buried conductor and which includes a nonconductive silicon segment, said nonconductive silicon segment at least partially overlying said buried conductor;
   c) a first conductive segment electrically coupled to said buried conductor and electrically coupled to said first conductive region so as to couple electrically said first conductive region with said buried conductor;
   d) a second conductive segment electrically coupled to said buried conductor and electrically coupled to said second conductive region so as to electrically couple said diffusion area with said second conductive region; and
   e) A non-connected conductive structure, said non-connected conductive structure at least partially overlying said nonconductive silicon segment, said non-connected conductive structure not being electrically connected to said buried conductor at that portion of said non-connected conductive structure which overlies said nonconductive silicon segment.

2. The buried interconnect of claim 1 wherein said buried conductor comprises silicon.

3. The buried interconnect of claim 1 wherein said buried conductor comprises metal.

4. The buried interconnect of claim 1 wherein said buried conductor comprises refractory metal silicide.

5. The buried interconnect of claim 1 wherein said buried conductor is formed by the deposition of a layer of conductive material and the subsequent etch of predetermined portions of said deposited layer of conductive material.

6. The buried interconnect of claim 1 wherein said layer of silicon comprises poly-epi silicon.

7. The buried interconnect of claim 1 wherein said layer of silicon comprises a deposited layer of amorphous silicon, said deposited layer of amorphous silicon having a polysilicon portion formed therein and an epitaxial silicon portion formed therein.

8. The buried interconnect of claim 1 wherein said layer of silicon is selective poly-epi silicon having a thickness of 500–2000 Å.

9. The buried conductor of claim 1 wherein said nonconductive silicon segment is an oxidized region of said layer of silicon.

10. The buried interconnect of claim 1 wherein said first and second conductive segments comprise silicon.

11. The buried interconnect of claim 1 wherein said first and second conductive segments comprise silicide.

12. The buried interconnect of claim 1 wherein said second conductive region comprises a transistor diffusion region.

13. The buried interconnect of claim 1 wherein said second conductive region comprises a gate.

14. The buried interconnect of claim 13 further comprising a conductive pad which is electrically coupled to said gate and which is electrically coupled to said second conductive segment and to said buried conductor, and to said gate.

15. The buried interconnect of claim 14 wherein said second conductive segment comprises a refractory metal silicide and wherein said conductive pad comprises a refractory metal.

16. The buried interconnect of claim 15 wherein the refractory metal comprises titanium nitride and wherein said refractory metal silicide comprises titanium silicide.

17. In a semiconductor device formed on a semiconductor substrate, said substrate having a plurality of device regions, said plurality of device regions including a first device and a second device region, said first device region including a diffusion region, said substrate further having a field oxide region and at least one gate, an improvement comprising:

a) a buried conductor which overlies predetermined areas of said field oxide region;

b) a layer of selective poly-epi silicon extending over said field oxide region and said buried conductor and extending through said diffusion region;

c) oxidized regions of said selective poly-epi silicon layer wherein at least one of said oxidized regions overlies said buried conductor;

d) a first conductive segment electrically coupled to said diffusion region of said first device region and electrically coupled to said buried conductor so as to electrically couple said diffusion region of said first device region with said buried conductor;

e) a second conductive segment, said second conductive segment electrically connected to said buried conductor and electrically coupled to said second device region so as to electrically couple said diffusion region of said first device region to said second device region: and f) a conductive structure, said conductive structure overlying said oxidized region of said layer of selective poly-epi silicon which overlies said buried conductor, said conductive structure not being directly electrically connected with said buried conductor.

18. The device of claim 17 wherein said buried conductor comprises doped silicon.

19. The device of claim 17 wherein said buried conductor comprises metal.

20. The device of claim 17 wherein said buried conductor comprises refractory metal silicide.

21. The semiconductor device of claim 17 further including a deposited layer of conductive material, said deposited layer of conductive material having an etched portion and a non-etched portion, and wherein said non-etched portion forms said buried conductor.

22. the device of claim 17 wherein said first conductive segment comprises doped silicon.

23. The device of claim 17 wherein said first conductive segment comprises silicide.

24. The device according to claim 17 wherein said second conductive segment includes a conductive pad.

25. The device according to claim 17 wherein said second conductive segment includes at least one gate, said gate crossing at least partially over said oxidized region of said poly-epi silicon layer which overlies said buried conductor.

26. The device of claim 17 wherein said layer of selective poly-epi silicon is formed by the solid phase epitaxy of a deposited layer of amorphous silicon.

27. The device of claim 17 wherein said layer of selective poly-epi silicon is formed by direct low temperature epitaxy.

28. The device of claim 27 wherein said layer of selective poly-epi silicon has a thickness of 500–2000 Å.

29. The device of claim 17 wherein said second conductive segment comprises a refractory metal conductive pad and a conductive silicide.

30. The device of claim 29 wherein said refractory metal conductive pad comprises titanium nitride, and wherein said conductive silicide comprises titanium silicide.

* * * * *